(12) United States Patent
Ye

(10) Patent No.: US 7,071,797 B2
(45) Date of Patent: Jul. 4, 2006

(54) METHOD AND APPARATUS FOR MINIMIZING INTERMODULATION WITH AN ASYMMETRIC RESONATOR

(75) Inventor: Shen Ye, Cupertino, CA (US)

(73) Assignee: Conductus, Inc., Sunnyvale, CA (US)

( * ) Notice: Subject to any disclaimer, the term of this patent is extended or adjusted under 35 U.S.C. 154(b) by 0 days.

(21) Appl. No.: 10/371,019

(22) Filed: Feb. 19, 2003

(65) Prior Publication Data

US 2003/0155990 A1    Aug. 21, 2003

Related U.S. Application Data

(60) Provisional application No. 60/358,434, filed on Feb. 19, 2002.

(51) Int. Cl.
*H01B 12/02*     (2006.01)

(52) U.S. Cl. .................... 333/204; 333/202; 505/210

(58) Field of Classification Search ................ 333/995, 333/204, 185, 134, 186, 99 S; 505/210, 505/700

See application file for complete search history.

(56) References Cited

U.S. PATENT DOCUMENTS

| | | | |
|---|---|---|---|
| 4,981,838 A | 1/1991 | Whitehead | |
| 5,760,667 A | 6/1998 | Young et al. | |
| 5,888,942 A | 3/1999 | Matthaei | |

(Continued)

FOREIGN PATENT DOCUMENTS

JP        11068404       3/1999

(Continued)

OTHER PUBLICATIONS

Chaloupka, H. et al., "Superconducting planar disk resonators and filters with high power handling capability," *Electronics Letters*, vol. 32, No. 18, pp. 1735-1737 (Aug. 29, 1996).

(Continued)

*Primary Examiner*—Dinh T. Le
(74) *Attorney, Agent, or Firm*—Merchant & Gould P.C.

(57) ABSTRACT

A method and apparatus to control intermodulation in a circuit for filtering over the air signals by creating an asymmetric resonator is disclosed. By creating the asymmetric resonator, the intermodulation from out of band signals is reduced while keeping the filter size relatively unchanged. In general, the intermodulation is reduced by lowering the current density in the resonator (e.g., so as to maintain the linearity of the electrical characteristics of the resonator), and more specifically by utilizing the principle that the inductive elements in a resonator experience the largest current changes. Therefore, the size of the inductor is changed in order to accommodate the larger power. An additional feature of the present invention is that not every inductive element of the filter needs to be enlarged. Generally only the first (or alternatively the first and second) resonators need to be increased in size. Another feature of the present invention is the physical order in which the filters are laid out. Laying out the components with the bandpass filter first can prevent (or significantly reduce) intermodulation generated by those components due to out-of-band interference signals.

14 Claims, 7 Drawing Sheets

U.S. PATENT DOCUMENTS

| | | | |
|---|---|---|---|
| 5,914,296 | A | 6/1999 | Shen |
| 5,922,650 | A * | 7/1999 | Ye .............................. 505/210 |
| 6,026,311 | A | 2/2000 | Willemsen Cortés et al. |
| 6,041,245 | A | 3/2000 | Mansour |
| 6,075,427 | A | 6/2000 | Tai et al. |
| 6,222,429 | B1 | 4/2001 | Satoh et al. |
| 6,370,404 | B1 * | 4/2002 | Shen ........................... 505/210 |
| 6,424,846 | B1 | 7/2002 | Cortés et al. |
| 6,529,750 | B1 * | 3/2003 | Zhang et al. ................ 505/210 |
| 6,633,208 | B1 | 10/2003 | Salkola et al. .............. 333/167 |
| 6,653,917 | B1 * | 11/2003 | Kang et al. ................ 333/99 S |
| 2001/0025013 | A1 | 9/2001 | Abdelmonem |
| 2001/0038320 | A1 | 11/2001 | Abdelmonem |

FOREIGN PATENT DOCUMENTS

| | | |
|---|---|---|
| WO | 99/52208 | 10/1999 |

OTHER PUBLICATIONS

Dahm, T. et al., "Analysis and Optimization of Intermodulation in High-$T_c$ Superconducting Microwave Filter Design," *IEEE Transactions On Applied Superconductivity*, vol. 8, No. 4, pp. 149-157 (Dec. 1998).

Liang, G. et al., "High-Power HTS Microstrip Filters for Wireless Communication," *IEEE Transactions On Microwave Theory And Techniques*, vol. 43, No. 12, pp. 3020-3029 (Dec. 1995).

Dahm, T. et al., "Theory of intermodulation in a superconducting microstrip resonator," *J. Appl. Phys.*, vol. 81, No. 4, pp. 2002-2009 (Feb. 15, 1997).

Maas, S., "Chapter 4: Volterra-Series And Power-Series Analysis," *Nonlinear Microwave Circuits*, pp. 155-207 (1988).

International Search Report for Application No. PCT/US02/16776 dated Sep. 23, 2002.

\* cited by examiner

METHOD AND APPARATUS FOR MINIMIZING INTERMODULATION WITH AN ASYMMETRIC RESONATOR

CROSS-REFERENCE TO RELATED APPLICATIONS

This application claims the benefit of the filing date of U.S. Provisional Patent Application Ser. No. 60/358,434 filed on Feb. 19, 2002 incorporated herein by reference.

FIELD OF THE INVENTION

The present invention relates generally to filters for electrical signals, more particularly to minimizing intermodulation in narrowband filters, and still more particularly to methods and apparatus to control intermodulation from an over the air signal with an asymmetric resonator.

BACKGROUND

Narrowband filters are particularly useful in the communications industry and particularly for wireless communications systems which utilize microwave signals. At times, wireless communications have two or more service providers operating on separate bands within the same geographical area. In such instances, it is essential that the signals from one provider do not interfere with the signals of the other provider(s). At the same time, the signal throughput within the allocated frequency range should have a very small loss.

Within a single provider's allocated frequency, it is desirable for the communication system to be able to handle multiple signals. Several such systems are available, including frequency division multiple access (FDMA), time division multiple access (TDMA), code division multiple access (CDMA), and broad-band CDMA (b-CDMA). Providers using the first two methods of multiple access need filters to divide their allocated frequencies in the multiple bands. Alternatively, CDMA operators might also gain an advantage from dividing the frequency range into bands. In such cases, the narrower the bandwidth of the filter, the closer together one may place the channels. Thus, efforts have been previously made to construct very narrow bandpass filters, preferably with a fractional-band width of less than 0.05%.

An additional consideration for electrical signal filters is overall size. For example, with the development of wireless communication technology, the cell size (e.g., the area within which a single base station operates) will get much smaller—perhaps covering only a block or even a building. As a result, base station providers will need to buy or lease space for the stations. Since each station requires many separate filters, the size of the filter becomes increasingly important in such an environment. It is, therefore, desirable to minimize filter size while realizing a filter with very narrow fractional-bandwidth and high quality factor Q.

As filter sizes get smaller, however, drawbacks arise. For example, the amount of power that can be handled by the circuit decreases. Also, as the frequency increases, then the uniformity of the cross sectional current density (in the current carrying conductors) decreases due to skin effect. For a planar microstrip type circuit, instead of a uniform current density (e.g., which occurs in a d.c. current), the current is highest at the edge of the conductor. Since the conductor has a limited cross section, this also tends to raise the average current in the conductor.

In a high temperature superconductor ("HTS") environment, if a current density reaching close to its critical current density exists in an HTS device, then that HTS device exhibits non-linearity. Thus, maintaining the current density well below the critical current level is desirable. However, in this type of environment in which small filter size is desired and when out-of-band interference signals are strong, then the non-linearity property of HTS can generate a high level intermodulation signal in band so as to make the channel unusable. This non-linearity results from the interference signal generating a very high current density in the HTS device.

Therefore, there exists a need for methods and apparatus to control intermodulation by creating a filter which is capable of filtering large out-of-band interference signals.

SUMMARY

The present invention provides for methods and apparatus to control intermodulation in a circuit for filtering over the air signals by creating an asymmetric resonator. By creating the asymmetric resonator, the intermodulation from out-of-band signals is reduced while keeping the filter size relatively unchanged. In general, the intermodulation is reduced by lowering the current density in the resonator (e.g., so as to maintain the linearity of the electrical characteristics of the resonator). Lowering the current density can be accomplished by creating a larger resonator. However, the present invention utilizes the principle that the inductive elements in a resonator experience the largest current changes. Therefore, while a larger resonator can be created to handle increased power signals, in the present invention, the size of the inductor is changed in order to accommodate the larger power.

An additional feature of the present invention is that not every inductive element of the filter needs to be enlarged. It will be appreciated that for out-of-band signals, most of these signals are reflected back by the first two resonators—with the first one reflecting the majority part. Negligible power reaches resonators beyond the first two resonators. Therefore, only the first (or alternatively the first and second) resonators need to be increased in size.

Another feature of the present invention is the physical order in which the filters are laid out. In general terms, for a communication or microwave system with multiple components cascaded together which include a bandpass filter, the bandpass filter should be placed first. This arrangement can reject any out-of-band interference signals to prevent them from reaching to the other components in the system (e.g., a bandstop filter). Therefore, laying out the components with the bandpass filter first can prevent (or significantly reduce) intermodulation generated by those components due to out-of-band interference signals.

A preferred embodiment in which this layout may be used is in the case of a notch filter arrangement. In the prior art, the signal was first applied to the notch filter and then to the bandpass filter. However, because the bandpass filter reflects a large portion of the signal back through the notch filter, this physical order resulted in high current densities in the notch filter and resultant nonlinearity. Therefore, the present invention preferably includes a physical arrangement of the filters wherein the bandpass filter is first and the bandstop filter is second.

In the preferred embodiment, the present invention is used in connection with narrow bandpass filters using L-C components. For example, an inductor with a shunt capacitor connected at each end of the inductor. Although this filter environment and its topology is used to describe the present invention, such environment is used by way of example, and the invention might be utilized in other environments (for example, other filter devices with lumped or distributed devices). Further, the environments of communications and wireless technology are used herein by way of example. The principles of the present invention may be employed in other environments as well. Accordingly, the present invention should not be construed as limited by such examples.

Therefore, according to one aspect of the invention, there is provided, a filter for an electrical signal, comprising: a first resonator, including: a first inductive element having a first conductive path width; a first capacitive element; a second resonator, electrically connected to the first resonator, including: a second inductive element having a second conductive path width which is less than the first conductive path width; a second capacitive element; and wherein the first conductive path width is arranged and configured to provide additional surface area for current in the first inductive element and reduce the current density of the first inductive element.

According to another aspect of the invention, there is provided an HTS filter device for filtering over the air signals, comprising: a plurality of L-C filter elements, each of said L-C filter elements comprising an inductor and a capacitor in parallel with the inductor; a plurality of Pi-capacitive elements interposed between the L-C filter elements, and wherein at least one of the inductor elements is arranged and configured to have a greater surface area than other inductor elements to minimize critical currents, whereby the linearity of the HTS filter device is maintained.

According to yet another aspect of the invention, there is provided a method of maintaining the linearity of an HTS filter exposed to out of band signals, comprising the steps of: connecting a first inductor and a first capacitor in parallel to form a first resonator; connecting a second inductor and a second capacitor in parallel to form a second resonator; electrically connecting the first and second resonators in series; and selecting the first inductor and increasing the surface area of the conductive path of the first inductor to minimize critical currents, whereby the linearity of the HTS filter device is maintained.

The invention may also be implemented as described in the preceding paragraph and further include the steps of connecting a third inductor and a third capacitor in parallel to form a third resonator; electrically connecting the third resonator in series downstream of the second resonator; and selecting the second inductor and increasing the surface area of the conductive path of the second inductor to minimize critical currents, whereby the linearity of the HTS filter device is maintained Still another aspect of the invention provides for a cascaded element filter for an electrical signal, comprising: a first bandpass filter, the bandpass filter arranged and configured to be physically first to receive the electrical signal, the bandpass filter reflecting out-of-band signals before the out-of-band signals are transmitted into the filter; and a second cascaded element, electrically connected to the first bandpass filter, and downstream of the bandpass filter, wherein out-of-band signals reaching the second cascaded element are minimized.

These and other advantages and features which characterize the present invention are pointed out with particularity in the claims annexed hereto and forming a further part hereof. However, for a better understanding of the invention, the advantages and objects attained by its use, reference should be made to the drawings which form a further part hereof, and to the accompanying descriptive matter, in which there is illustrated and described preferred embodiments of the present invention.

BRIEF DESCRIPTION OF THE DRAWINGS

In the Drawings, wherein like reference numerals and letters indicate corresponding elements throughout the several views:

FIGS. 6a and 6b illustrate a schematic cross-section of a conductor of an inductive element with the conductor of FIG. 6b being twice the length of the conductor of FIG. 6a.

DETAILED DESCRIPTION

The principles of this invention apply to the filtering of electrical signals. The preferred apparatus and method of the present invention provides for methods and apparatus to control intermodulation in a circuit for filtering over the air signals by creating an asymmetric resonator. By "asymmetric" what is meant is that the inductive elements of the resonator are not symmetrical in size with one another. By making either the first, or alternatively the first and second, inductive element of the resonator larger, the current density is lowered. More specifically, because much of the current is carried near the edges of the conductive path in the high frequency environment in which the present invention may be employed, a larger inductive element with a larger edge area reduces the current density. Therefore, by creating an asymmetric resonator, the intermodulation from out-of-band signals is reduced while keeping the filter size relatively unchanged.

As noted above, it is preferred to change the size of only the first or first and second inductive elements since the inductive elements in a resonator experience the largest current changes. However, it is possible to also make one or more capacitors larger if the design considerations and/or the footprint of the filter allow.

Another consideration which allows a limited number of inductive elements to be changed is that most out-of-band signals are reflected away by the first two resonators—with the first one reflecting the majority part. Since negligible power reaches resonators away from the first two resonators, only the first (or alternatively the first and second) resonators need to be increased in size.

Prior to a discussion of a preferred layout and modeling of the present invention, a brief discussion of the increased surface area associated with an increased cross sectional area of a conductor will be presented.

Figure 6A:
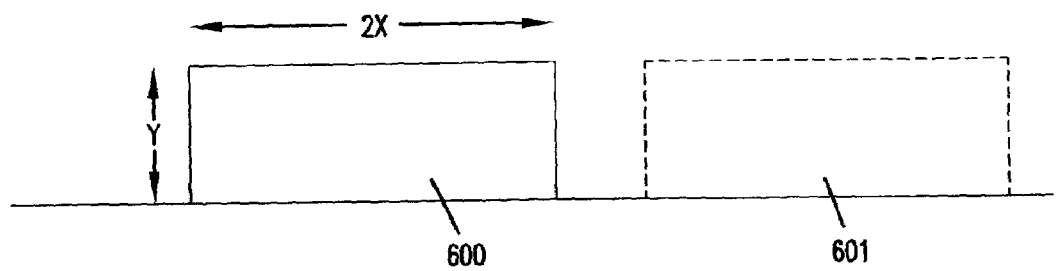
Figure 6B:
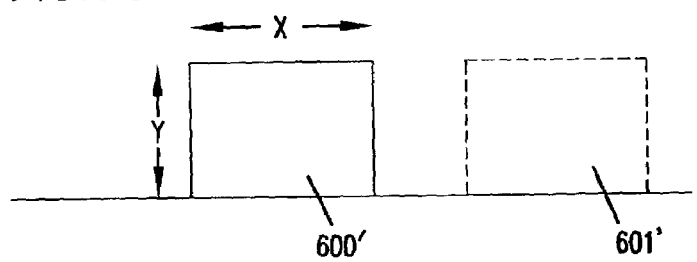

Turning first to FIGS. 6a and 6b, a schematic cross-section of a conductor 600 and 600' of differing inductive elements (best seen in FIGS. 2–4) is shown. The conductor 600 of FIG. 6a has a height of "y" and a width of "2x". The conductor 600' of FIG. 6b has a height of "y" and a width of "x". Those of skill in the art will appreciate that the conductor of FIG. 6a includes more surface area associated with the additional "x' width. If the second inductor is also increased in size, then second inductor 601' would be enlarged to 601.

The additional surface area needed for a given inductor in a resonator can be calculated empirically (or found theoretically) to provide additional surface area of the conductive path forming the inductor. For example, measurements can be taken in various locations to determine the signal strength of out-of-band signals. The width of the inductive element may then be determined in order to limit the likelihood of a critical current density being reached in the inductive element from the out of band signals. Alternatively, this can be done theoretically. Other factors which can be considered include the type of HTS device, the criticality of the HTS filter being in a non-linear mode for a period of time, and the available footprint for the filter.

Figure 7:
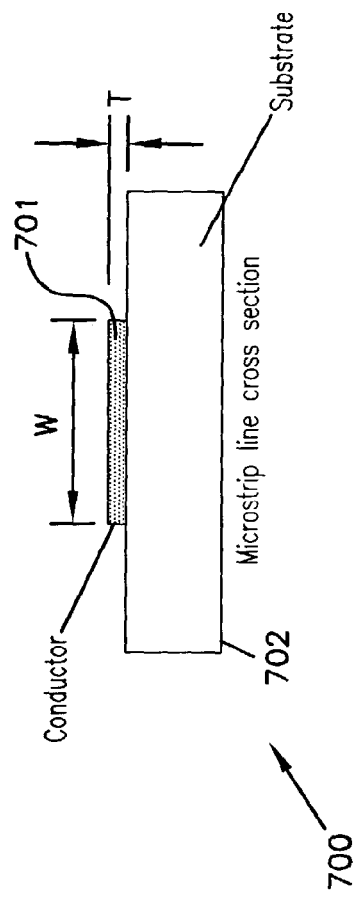
FIG. 7 illustrates a microstrip line cross section with a conductor thereon which may be useful in determining the strip width (W) of a layout.

In FIG. 7, a microstrip line cross section is designated at 700. A representative conductor 701 is shown on substrate 702. The conductor 701 has a width (W) and a thickness (T). Given a fixed conductor strip of thickness (T), an increase in the strip width (W) will reduce the current density. In the case of a direct current, when doubling the strip width, the current density will be reduced by half. This would have the effect of increasing the power handling capability by four (4) times since power equals resistance times current squared:

$$Power = R * I^2$$

At higher frequencies, however, the current density will not be reduced uniformly due to edge or skin effect. In this case, the resulting current density, although generally reduced by the increase in strip width (W), can be determined by an accurate electromagnetic simulator.

An example methodology for determining the line width (W) for a filter is described next. First an out-of-band interference signal is selected and the signal is input to the bandpass filter. The current density of the first resonator(s) from the input side are then simulated. The inductor strip widths (W) are increased (or the resonator size is increased) for the inductor(s) with the highest current density. Additional increases in size are performed until the current densities are at an equal level between the resonators (or are close to an equal level). The reduced amount of intermodulation from out-of-band interference signals can then be estimated by the reduction of current density before and after the design modifications. One software tool that can be used in connection with design and simulation of filters, including current density simulation, is the tool sold under the designation IE3D from Zeland Software of Fremont, Calif.

Figure 1:
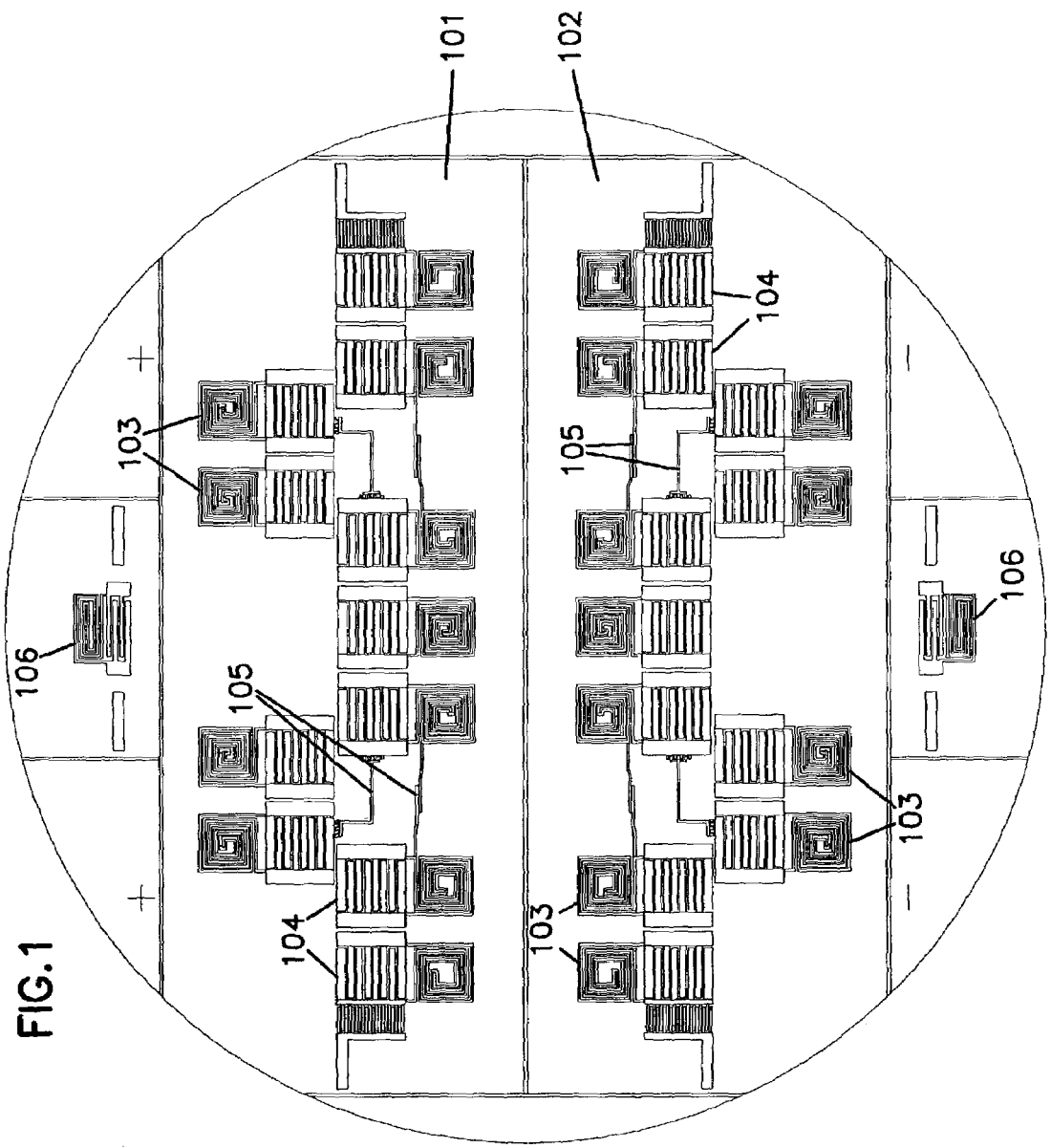
FIG. 1 illustrates a filter useful in a cellular communications environment, and in particular illustrates an example of a cellular HTS B-band filter (835–849 MHz) with uniform resonators.

Now turning to FIG. 1, two filters 101 and 102 are shown laid out on a four (4) inch plate. The inductive elements are shown generally at 103 and capacitors at 104. Cross coupling is provided at 105. The devices shown at 106 are used for test purposes. It will be appreciated that each and every device in the filters 101 and 102 has not been designated, but it will be understood that such devices are generally equivalent to the devices which are shown and described. The filters 101 and 102 are useful in a cellular communications environment, and in particular illustrate an example of a cellular HTS B-band filter (835–849 MHz) with uniform resonators.

Figure 2:
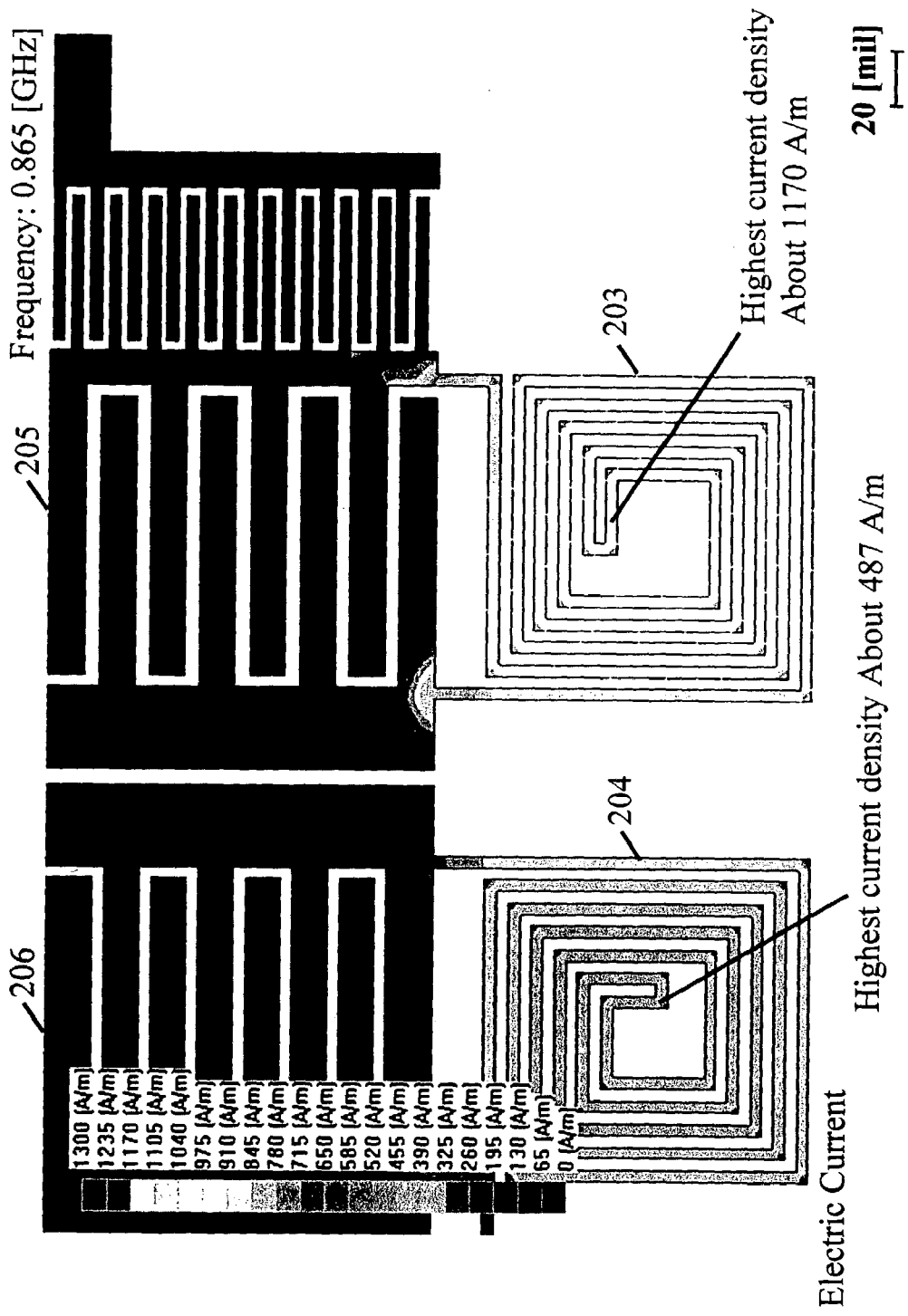
FIG. 2 illustrates a current density simulation of the filter in FIG. 1 with an out-of-band signal at 865 MHz. The inductor part of the first resonator has the highest current density which is significantly higher than that of the second resonator.
Figure 3:
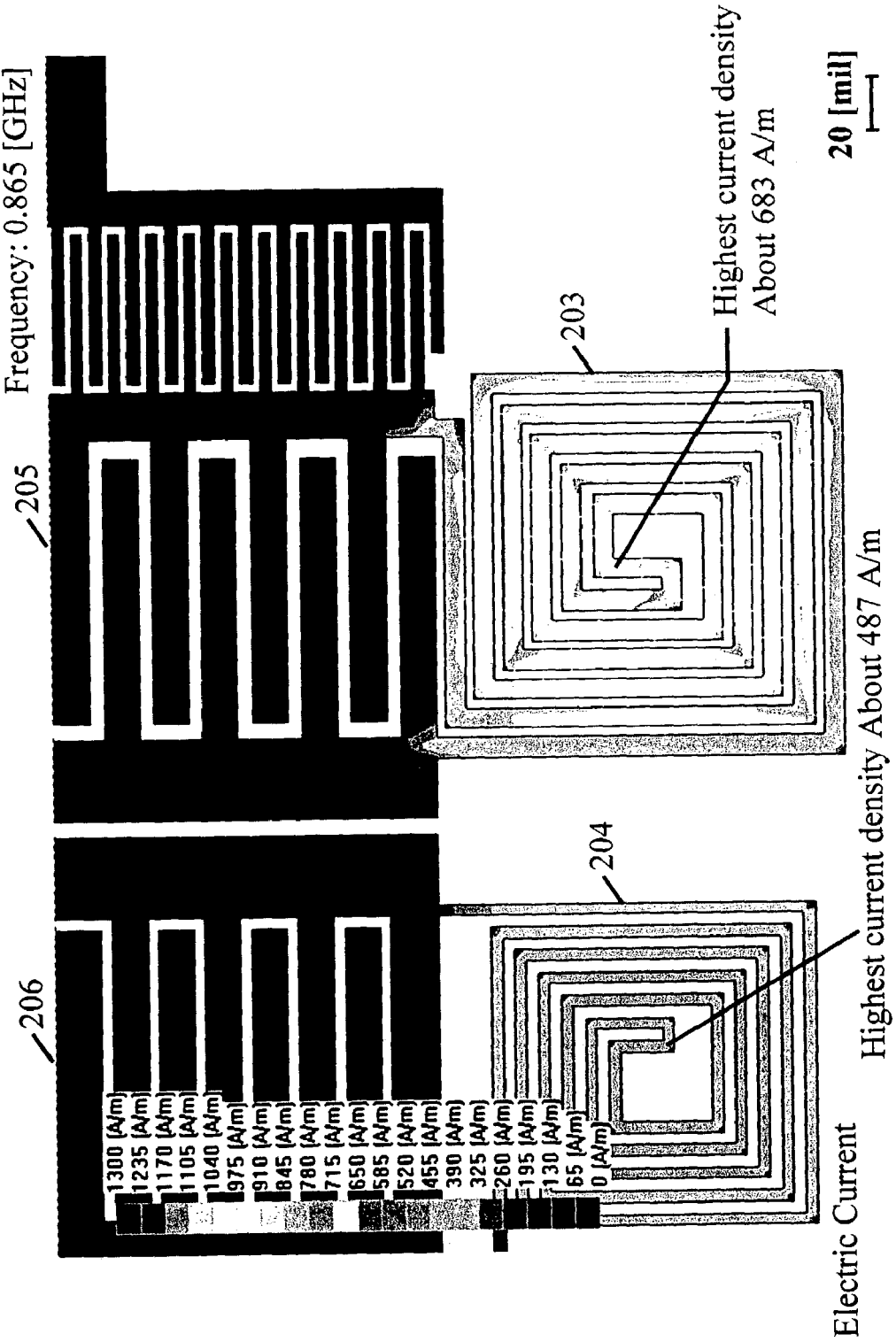
FIG. 3 shows a current density simulation of the filter in FIG. 1 but with an enlarged inductor portion of the first resonator. The current density is effectively reduced while the current density in the second resonator is unchanged.
Figure 4:
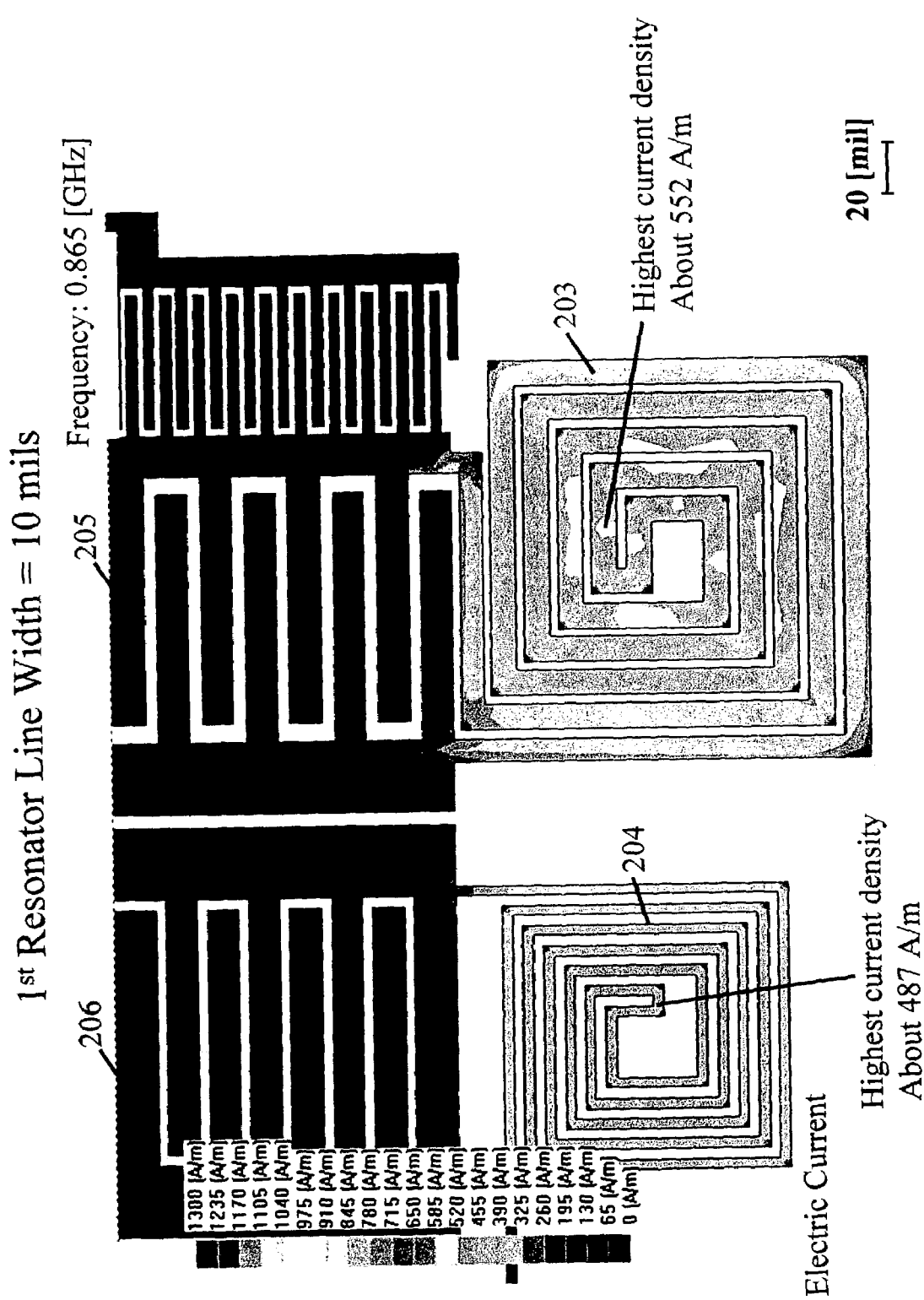
FIG. 4 shows a current density simulation of the filter in FIG. 1 but with a further enlarged inductor portion of the first resonator. Compared with FIG. 2, the current density is significantly reduced and is now almost the same as that in the second resonator.
Figure 8:
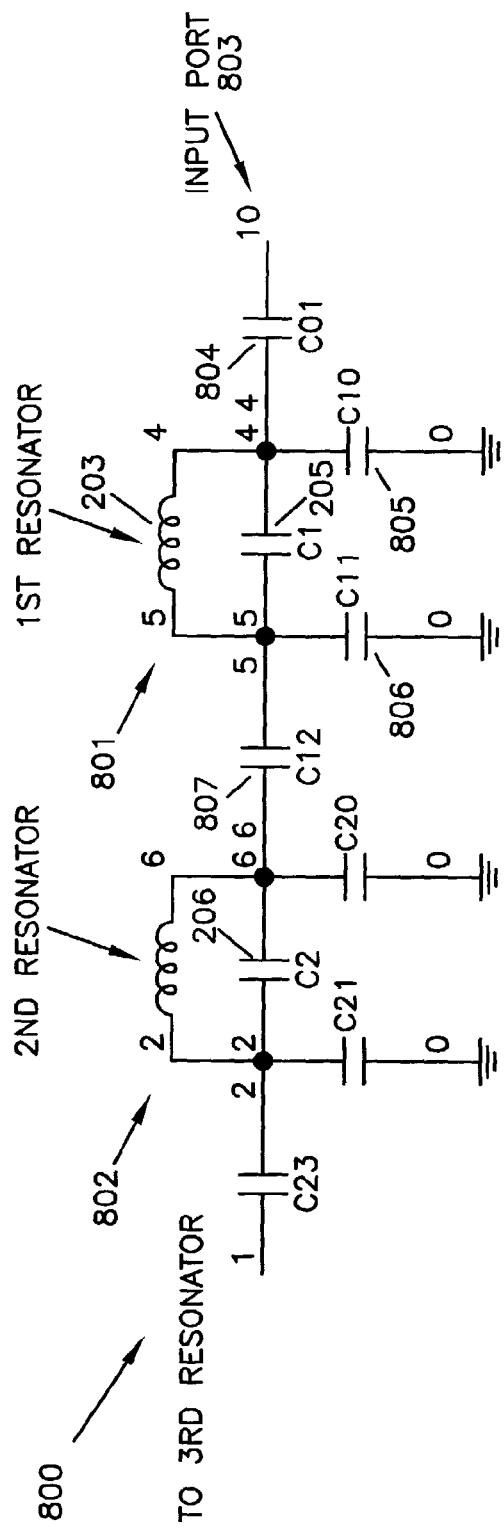
FIG. 8 schematically illustrates the filter of FIGS. 2–4.

FIG. 8 provides a schematic drawing of the devices shown in the simulation in FIGS. 2 through 4. The two resonators are shown generally at 800. The first resonator is designated as 801 and the second resonator is designated as 802. The arrangement and interconnection of the capacitors and inductors are similar between the first resonator 801 and the second resonator 802. Therefore, the devices will only be described with respect to the first resonator 801. It will be appreciated, however, that the design can vary between the resonators and/or that devices with different values may be employed in the filter design. Input port 803 is coupled to the resonator 801 via coupling capacitor 804. Inductor 203 is the inductive element of the first resonator 801. Capacitor 205 is the capacitive element of the first resonator 801. End shunt capacitors 805 and 806 are connected to each end of the resonator couple of inductor 203 and capacitor 205. End gap coupling capacitor 807 provides coupling to the subsequent or second resonator 802.

FIG. 2 illustrates a current density simulation of the filter in FIG. 1 with an out-of-band signal at 865 MHz. Only the first two resonators (e.g. resonators 801 and 802 shown in FIG. 8) of the filter illustrated in FIG. 1 are simulated in FIGS. 2–4. The variations in color indicate the current density level of the device. The current density changes in the device based on the location in its geometry, cross sectional area, etc. The inductor portion 203 of the first resonator has the highest current density. The current density is significantly higher than that of the second resonator 204. The highest current density in first inductor 203 is about 1170 A/m, while the highest current density in the second inductor 204 is about 487 A/m. The width of the inductor elements 203 and 204 are both 4 mils in FIG. 2.

FIG. 3 shows a second current density simulation of the filter in FIG. 1, but with an enlarged inductor portion 203' of the first resonator 801. The color mapping of the inductor 203' illustrates that the current density is effectively reduced. The highest current density in the inductor 203' of the first resonator 801 is about 683 A/m, while the highest current density in the inductor 204 of the second resonator 802 is about 487 A/m (i.e., about the same current density before the adjustment was made to the first inductor 203'). Therefore, the current density in the second resonator 802 (comprised of capacitor 206 and inductor 204) is unchanged. The capacitor elements 205 and 206 are not changed by enlarging the width (W) of the inductor 203'. The width of inductor 203' is 7 mils in FIG. 3.

FIG. 4 shows a current density simulation of the filter in FIG. 1, but with a further enlarged inductor part 203" of the first resonator. Compared with FIG. 2, the current density is significantly reduced, which is now almost the same as that in the second resonator 204. The current density in inductor 203" of the first resonator is about 552 A/m, while the highest current density in inductor 204 remains at about 487 A/m. In FIG. 4, the line width is 10 mils, or two and one-half times the width of the inductor 203.

Figure 5:
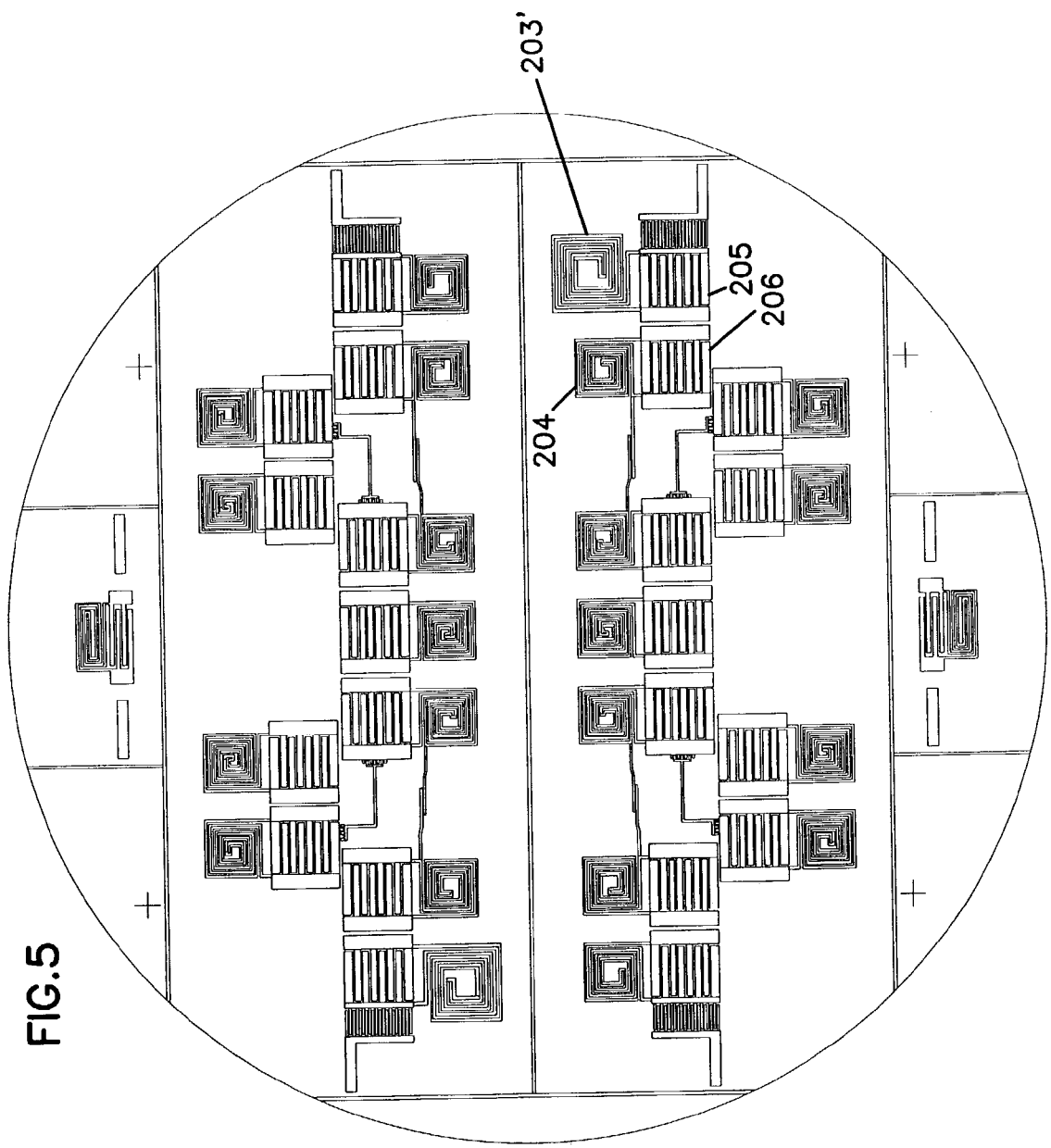
FIG. 5 shows a layout with an enlarged first resonator. As a whole filter, its size is almost unchanged. However, with the larger inductor portion of the first resonator, the out-of-band interference rejection performance of the filter is significantly improved.

FIG. 5 shows a layout with enlarged first resonator 203'. As a whole filter, its size is almost unchanged. However, with the larger inductor part 203' of the first resonator, the out-of-band interference rejection performance of the filter is significantly improved.

Figure 9:
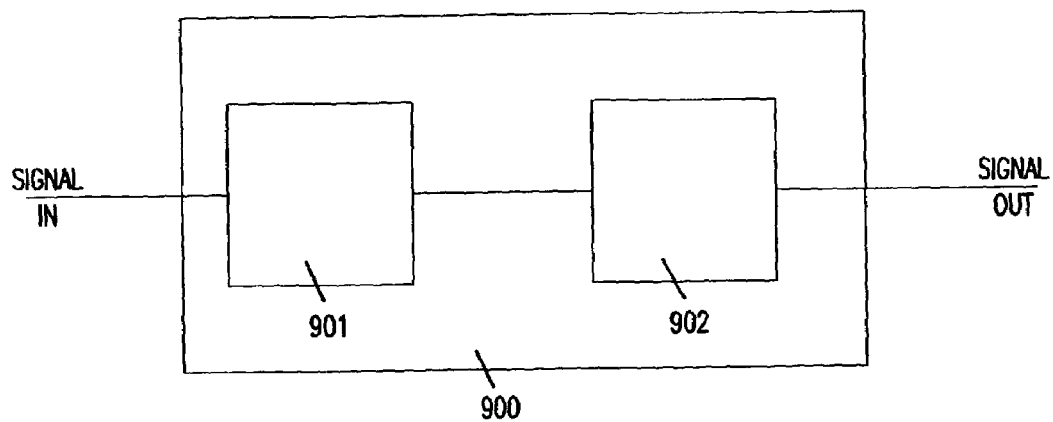
FIG. 9 shows a physical layout in which the bandpass filter is first and the bandstop filter is second.

Turning now to FIG. 9, a schematic bandpass, notch physical layout is shown. Here the signal in is applied to the filter 900. The bandpass filter 901 is arranged and configured to receive the input signal (i.e., it is physically first in the signal path). In the prior art, if the bandpass filter was not placed first, out-of-band interference signals traveled through the first filter (for example a bandstop filter), encountered the bandpass filter, and were then reflected back through the bandstop filter. Therefore, the prior art physical order can result in high current densities in the notch filter and result in unwanted nonlinearity. Therefore, the present invention preferably includes a physical arrangement of the filters wherein the bandpass filter is first and the bandstop filter is second.

Further, in the case of strong out-of-band interference signals that pass through the bandstop filter and the interconnection to the bandpass filter, it is possible for it to generate in-band intermodulation signals which pass through the bandpass filter. By placing the bandpass filter first in the signal path, however, out-of-band interference signals are reflected back before being propagated further into the filter. Accordingly, the placing the bandpass filter physically first before other filter elements provides advantages.

Placing the bandpass filter first may also be generalized further for a communication or microwave system with multiple components cascaded together which include a bandpass filter. In these other environments, placing the bandpass filter first may provide the advantages of reflecting away out-of-band signals. More specifically, this arrangement can reject any out-of-band interference signals to prevent them from reaching to the other components in the system (e.g., a bandstop filter). Therefore, laying out the components with the bandpass filter first can prevent (or significantly reduce) intermodulation generated by those components due to out-of-band interference signals.

The filter devices of the invention are preferably constructed of materials capable of yielding a high circuit Q filter, preferably a circuit Q of at least 10,000 and more preferably a circuit Q of at least 40,000. Superconducting materials are suitable for high Q circuits. Superconductors include certain metals and metal alloys, such a niobium as well as certain Perovskite oxides, such as $YBa_2Cu_3O_{7-*}$ (YBCO). Methods of deposition of superconductors on substrates and of fabricating devices are well known in the art, and are similar to the methods used in the semiconductor industry.

In the case of high temperature oxide superconductors of the Perovskite-type, deposition may be by any known method, including sputtering, laser ablation, chemical deposition or co-evaporation. The substrate is preferably a single crystal material that is lattice-matched to the superconductor. Intermediate buffer layers between the oxide superconductor and the substrate may be used to improve the quality of the film. Such buffer layers are known in the art, and are described, for example, in U.S. Pat. No. 5,132,282 issued to Newman et al., which is hereby incorporated herein by reference. Suitable dielectric substrates for oxide superconductors include sapphire (single crystal $Al_2O_3$), lanthanum aluminate ($LaAlO_3$), magnesium oxide (MgO) and yttrium stabilized zirconium (YSZ).

The YBCO is typically deposited on the substrate using reactive co-evaporation, but sputtering and laser ablation could also be used. A buffer layer may be used between the substrate and the YBCO layer, especially if sapphire is the substrate. Photolithography is used to pattern the filter structure.

In the preferred embodiment, the present invention is used in connection with narrow band filters using L-C components. For example, an inductor with a shunt capacitor connected at each end of the inductor. Although this filter environment and its topology is used to describe the present invention, such environment is used by way of example, and the invention might be utilized in other environments (for example, other filter devices with lumped or distributed devices). Further, the environments of communications and wireless technology are used herein by way of example. The principles of the present invention may be employed in other environments as well. Accordingly, the present invention should not be construed as limited by such examples.

As noted above, a preferred use of the present invention is in communication systems and more specifically in wireless communications systems. However, such use is only illustrative of the manners in which filters constructed in accordance with the principles of the present invention may be employed.

It is to be understood that even though numerous characteristics and advantages of the present invention have been set forth in the foregoing description, together with details of the structure and function of the invention, the disclosure is illustrative only and changes may be made in detail. Other modifications and alterations are well within the knowledge of those skilled in the art and are to be included within the broad scope of the appended claims.

What is claimed is:

1. A filter for an electrical signal, comprising:
   a. a first resonator for receiving an input signal, including:
      i. a first inductive element having a first conductive path width;
      ii. a first capacitive element;
   b. a second resonator, electrically connected to the first resonator, for providing a filtered output signal, including:
      i. a second inductive element having a second conductive path width;
      ii. a second capacitive element; and
   c. wherein the first conductive path width is greater than the path width of the second conductive path, so as to substantially maintain the linearity of the filter when exposed to out of band signals, and is arranged and configured to provide additional surface area for current in the first inductive element and reduce the current density of the first inductive element.

2. The filter of claim 1, wherein each of the elements are laid out in a microstrip topology.

3. The filter of claim 2, wherein the micro-strip topology includes a dielectric substrate of either MgO, $LaAlO_3$, $Al_2O_3$, or YSZ.

4. The filter of claim 3, wherein each of the elements are formed from a conductive material on the dielectric substrate.

5. The filter of claim 1, further comprising:
a. a first pair of shunt capacitors connected to the ends of the first inductive element; and
b. a second pair of shunt capacitors connected to the ends of the second inductive element.

6. The filter of claim 5, further comprising a coupling capacitor for coupling the first and second resonator and an input coupling capacitor.

7. The filter of claim 1, wherein the first resonator is physically located first in an incoming signal path.

8. The filter of claim 1, further comprising a third resonator, and wherein the second inductive element has a larger line width than a third inductive element in the third resonator.

9. The filter of claim 1, wherein the first and second capacitive elements have generally equivalent layout structures.

10. An HTS filter device for filtering input signals, comprising:
a. a plurality of L-C filter elements arranged to receive said input signals and to provide a filtered output signal, each of said L-C filter elements comprising an inductor and a capacitor in parallel with the inductor;
b. a plurality of Pi-capacitive elements interposed between the L-C filter elements, and
c. wherein at least one of the inductor elements is arranged and configured to provide a greater path conductive width than other inductor elements to substantially maintain linearity of the HTS filter device, when exposed to out of band signals.

11. The filter of claim 10, wherein the at least one inductor element is physically located first to receive the input signal.

12. The filter of claim 10, wherein the first two inductor elements have a greater conductive path width than the inductor elements downstream from an incoming signal.

13. A method of maintaining the linearity of an HTS filter exposed to out of band signals, comprising the steps of:
a. connecting a first inductor and a first capacitor in parallel to form a first resonator, wherein the first inductor comprises a first conductive path having a first path width, and wherein the first resonator is arranged to receive an input signal;
b. connecting a second inductor and a second capacitor in parallel to form a second resonator, wherein the second inductor comprises a second conductive path having a second path width, and wherein the second resonator is arranged to provide a filtered output signal;
c. electrically connecting the first and second resonators in series; and d. increasing the first path width of the first conductive path of the first inductor, relative to the second path width of the second conductive path of the second inductor, to substantially maintain the linearity of the HTS filter device, when exposed to out of band signals.

14. The method of claim 13, further comprising the steps of:
a. connecting a third inductor and a third capacitor in parallel to form a third resonator, wherein the third inductor comprises a third conductive path having a third path width;
b. electrically connecting the third resonator in series downstream of the second resonator; and
c. increasing the second path width of the second conductive path of the second inductor, relative to the third path width of the third conductive path of the third inductor, to substantially maintain the linearity of the HTS filter device, when exposed to out of the band signals.

* * * * *

UNITED STATES PATENT AND TRADEMARK OFFICE
CERTIFICATE OF CORRECTION

| | | |
|---|---|---|
| PATENT NO. | : 7,071,797 B2 | Page 1 of 1 |
| APPLICATION NO. | : 10/371019 | |
| DATED | : July 4, 2006 | |
| INVENTOR(S) | : Ye | |

It is certified that error appears in the above-identified patent and that said Letters Patent is hereby corrected as shown below:

Col. 8, line 54, claim 1: "maintain the linearity" should read --maintain linearity--

Col. 8, line 57, claim 1: "reduce the current" should read --reduce current--

Col. 10, line 1, claim 13: "maintaining the linearity" should read --maintaining linearity--

Col. 10, line 14, claim 13: "d. increasing the first" should start a new paragraph Signed and Sealed this Third Day of April, 2007

JON W. DUDAS
*Director of the United States Patent and Trademark Office*